United States Patent [19]

Matsushita et al.

[11] Patent Number: 4,749,867
[45] Date of Patent: Jun. 7, 1988

[54] EXPOSURE APPARATUS

[75] Inventors: Koichi Matsushita, Chiba; Junji Isohata, Tokyo; Hironori Yamamoto, Chigasaki; Makoto Miyazaki, Yokohama; Kunitaka Ozawa, Isehara; Hideki Yoshinari, Yokohama, all of Japan

[73] Assignee: Canon Kabushiki Kaisha, Tokyo, Japan

[21] Appl. No.: 856,221

[22] Filed: Apr. 28, 1986

[30] Foreign Application Priority Data

Apr. 30, 1985 [JP] Japan .................................. 60-90894
Jun. 4, 1985 [JP] Japan .................................. 60-119753

[51] Int. Cl.$^4$ .............................................. G01B 11/26
[52] U.S. Cl. .............................. 250/442.1; 250/492.1; 355/67
[58] Field of Search ............... 250/440.1, 441.1, 442.1, 250/491.1, 492.1, 492.2, 492.24; 356/363, 358; 355/67, 73, 76

[56] References Cited

U.S. PATENT DOCUMENTS

| | | | |
|---|---|---|---|
| 3,648,048 | 3/1972 | Cahzu et al. | 250/492.2 |
| 4,057,347 | 11/1977 | Moriyama et al. | 250/491.1 |
| 4,093,378 | 6/1978 | Horr et al. | 355/76 |
| 4,189,230 | 2/1980 | Zasio | 355/76 |
| 4,469,949 | 9/1984 | Mori et al. | 250/491.1 |
| 4,475,223 | 10/1984 | Taniguchi et al. | 250/491.1 |
| 4,555,630 | 11/1985 | Sheets et al. | 250/492.1 |

Primary Examiner—Bruce C. Anderson
Assistant Examiner—Paul A. Guss
Attorney, Agent, or Firm—Fitzpatrick, Cella, Harper & Scinto

[57] ABSTRACT

An exposure apparatus for exposing in a step-and-scan manner a plate-like member to a pattern with radiation so that images of the pattern are transferred onto different regions on the plate-like member. The apparatus includes a mirror imaging optical system for projecting the image of the pattern onto the plate-like member, a carriage for scanningly moving, at the time of exposure, the plate-like member relative to the mirror imaging system, and a stage movably mounted on the carriage for step-feeding the plate-like member at the time of non-exposure so as to sequentially place the different regions of the plate-like member at an exposure station under the mirror imaging system. A locking system is provided to lock the stage relative to the carriage by use of vacuum, at the time of exposure, whereby unwanted displacement of the plate-like member relative to the carriage at the time of scanning exposure is prevented. Also, any positional deviation which may be caused by the locking of the stage is compensated for, by controlling supply of air pressure to linear air-bearings supporting the carriage.

19 Claims, 5 Drawing Sheets

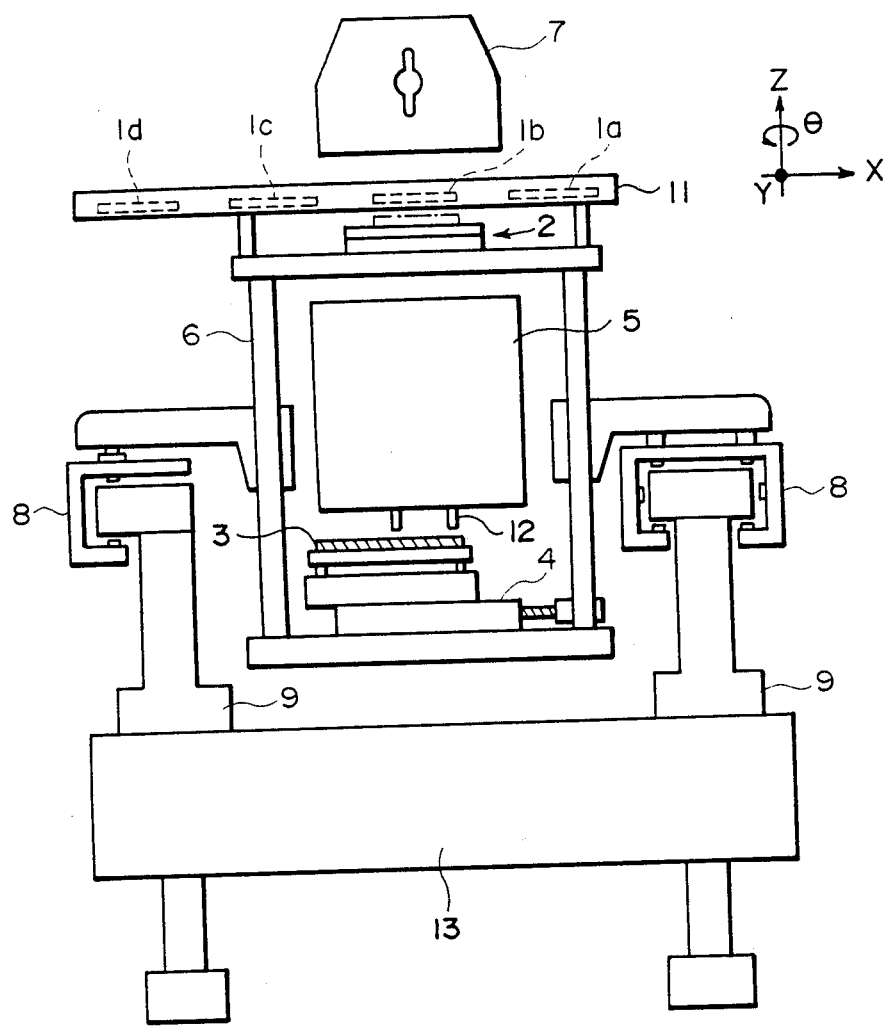
F I G. 1

EXPOSURE APPARATUS

FIELD OF THE INVENTION AND RELATED ART

This invention relates to an exposure apparatus for exposing a plate-like member to a pattern with radiation in a step-and-repeat manner so as to transfer images of the pattern onto different regions on a surface of the plate-like member, respectively. More particularly, the invention is concerned with an exposure apparatus such as mentioned above which is arranged to effect scanning exposure.

Exposure apparatuses are known, e.g., in the field of manufacture of semiconductor devices such as integrated circuits, as and means for photolithographically transferring a fine pattern of a mask or reticle onto a substrate or semiconductive wafer. Various types of exposure apparatuses, such as contact type, proximity type, mirror projection type, lens projection type, etc., have been developed.

Of these exposure apparatuses, the mirror projection type exposure apparatus is arranged such that a mask having a fine pattern formed thereon and a plate-like member (semiconductor wafer) onto which the pattern is to be transferred are carried by a carriage in a predetermined positional relation and the carriage is scanningly moved during exposure, whereby the image of the pattern as a whole is "printed" on the plate-like member. In this type of exposure apparatus, in order to meet enlargement of the size of the mask in accordance with the enlargement of the size of the plate-like member, aiming at reduction in the manufacturing cost per one chip (semiconductor chip), or in accordance with a desire for using the apparatus for the sake of manufacture of large-size flat-panel liquid crystal display devices (for use in TV display devices or the like), it is necessary to enlarge or expand the field of exposure to be obtained at a moment during the scanning exposure and also to increase the amount of scanning movement. This results in disadvantageous enlargement of the size of the exposure apparatus.

This problem can be obviated if the transfer of a pattern of large size to the plate-like member is effected by plural shots. That is, the surface of the plate-like member is divided into different regions and the scanning exposure is repeatedly effected relative to the different regions of the plate-like member in sequence. Whereby, a substantially integral pattern is transferred onto the plate-like member. This is referred to in this Specification as a "step-and-scan exposure" . To achieve this, an X-Y stage of the same type as that used in steppers (step-and-repeat type lens-projection exposure apparatuses) or the like may be mounted on the carriage carrying the mask and the plate-like member.

If, however, such X-Y stage is carried by the carriage and images of the pattern are transferred onto the plate-like member in the step-and-scan exposure manner, there is a possibility of occurrence of positional deviation between the images transferred onto the plate-like member. One occasion of this will be such as follows:

That is, the X-Y stage is so made that it is movable easily in order to achieve fine position-adjustment for the sake of absolute positioning of the plate-like member, relative positioning of the plate-like member with respect to the mask, etc. and/or in order to achieve high-speed movement for the sake of step-feeding of the plate-like member (sequential movement by regular amounts for sequentially placing the different shot areas of the plate-like member at the exposure station). On the other hand, usually the X-Y stage has a relatively heavy weight of an order of 40 kg. For these reasons, when the carriage carrying the X-Y stage is scanningly moved for the sake of scanning exposure, the X-Y stage carried on the carriage cannot follow the acceleration of the carriage due to its inertia, with the result that the positional relation between the X-Y stage and the carriage established at the time prior to initiation of the scanning movement of the carriage is changed.

SUMMARY OF THE INVENTION

It is accordingly a primary object of the present invention to provide an exposure apparatus of step-and-scan type, by which patterns are accurately transferred onto different regions of a plate-like member.

Briefly, according to the present invention, there is provided an apparatus for exposing a plate-like member to a pattern with radiation so that an image of the pattern is transferred onto the plate-like member, said apparatus comprising: a movable carriage; a movable stage for carrying thereon the plate-like member, said stage being carried by said carriage for movement relative to it; means for exposing the plate-like member to the pattern with radiation, said exposing means exposing the plate-like member by scanning the plate-like member with the radiation with an aid of movement of said carriage; means for controlling movement of said stage when the plate-like member is not exposed by said exposing means; and means for locking said stage relative to said carriage at a time of exposure of the plate-like member with said exposing means.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 1 is a schematic view of an exposure apparatus to which an embodiment of the present invention pertains.

DESCRIPTION OF THE PREFERRED EMBODIMENTS

Figure 2:
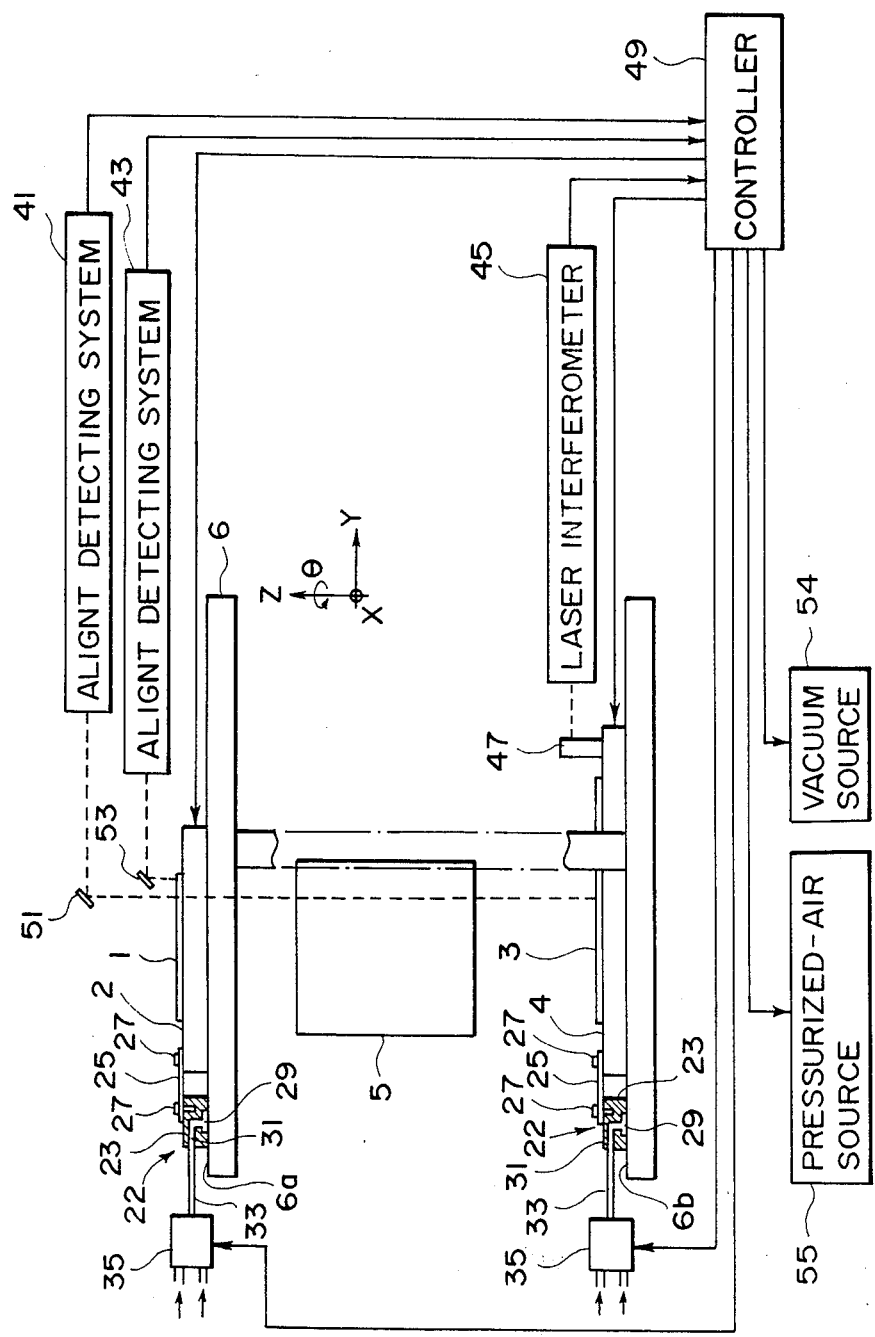
FIG. 2 is a schematic and diagrammatic view showing a major portion of an exposure apparatus according to one embodiment of the present invention.

Referring first to FIG. 1, there is shown an exposure apparatus which is usable in the manufacture of large-size flat-panel display devices and to which the present invention pertains. As shown in FIG. 1, the exposure apparatus is usable with four photomasks 1 (1a, 1b, 1c and 1d) each having a fine pattern formed on its lower surface. The exposure apparatus includes a mask stage 2 for carrying thereon one of the masks 1a–1d at a time. The mask stage 2 is movable in each of X, Y and θ (rotational) directions for fine adjustment of the position of the mask carried by the mask stage. Denoted in this Figure by numeral 3 is a glass substrate or base plate of rectangular shape having a diagonal length of an order of fourteen (14) inches. For the manufacture of a liquid crystal panel display device, for example, a number of displaying picture elements as well as switching transistors for controlling actuation and de-actuation of the picture elements, capacitors, connecting terminals and so on are to be formed on the surface of the glass base plate 3 by ordinary photolithographic processes. The glass base plate 3 is held by a base-plate carrying stage 4 which is movable in each of the X, Y and $\theta$ (rotational) directions. Also, the stage 4 is arranged to be moved stepwise in each of the X and Y directions, for the sake of plural-shot exposure (four-shot exposure in this case) of the glass base plate 3 as will be described later. Such step-feeding of the stage 4 is controlled by a fine movement-measuring system using a laser interferometer, not shown. The exposure apparatus further includes a mirror projection optical system 5 of known type, comprising a combination of trapezoidal, concave and convex mirrors. The mirror projection system is adapted to project, onto the glass base plate 3 at a unit magnification, an image of the pattern of one of the masks 1a–1d which is held at a predetermined position (exposure station) by the mask stage 2. A carriage 6 is provided to hold the mask stage 2 and the base-plate stage 4 in a predetermined relation.

An illumination optical system 7 includes a light source (not shown) for providing light of a predetermined wavelength or wavelength range to illuminate one of the masks held at the predetermined exposure station by the mask stage 2. By exposing a photosensitive layer formed on the glass base plate 3 to light passed through the pattern of the mask held by the mask stage 2, the fine pattern of such mask is photolithographically transferred onto the glass base plate 3. The mirror projection system 5 is disposed such that its optical axis is accurately aligned with the optical axis of the illumination optical system 6.

Denoted by numerals 8 are linear air-bearing assemblies (hereinafter simply "LAB") which are movable along two guide rails 9 extending in the Y direction. One of these bearing assemblies (LAB) is of the type in which it is constrained with respect to movement in the X direction (positive and negative) and in a Z direction (positive and negative). The other of the bearing assemblies is of the type in which it is constrained with respect to movement in the Z direction. The carriage 6 is supported by the LAB 8. With this arrangement, the mask 1 carried by the mask stage 2 and the glass base plate 3 carried by the base-plate stage 4 can be scanningly moved as a unit in the Y direction relative to the projection system 5, during the exposure of the mask and the base plate to the light emitted from the illumination optical system 7. One complete movement of the carriage 6 is effective to achieve one scanning exposure relative to one-fourth (¼) of the base plate 3 with corresponding mask 1a, 1b, 1c or 1d.

The exposure apparatus further includes a mask feeder 11 carrying the masks 1a–1d and for sequentially feeding the masks 1a–1d to the exposure station on the mask stage 2. That is, the mask feeder 11 is arranged to change masks each time the scanning exposure of one of different areas on the glass base plate 3 is completed. Gap sensors denoted by numeral 12 are provided to detect the distance between the surface of the base plate 3 and the focal plane of the projection optical system 5.

For example, air-microsensors utilizing air pressure or photoelectric sensors utilizing reflection light from the base plate 3 are usable as the gap sensors. The projection optical system 5, the illumination optical system 7 and the guide rails 9 are supported by a base or surface plate 13 in a predetermined interrelation.

Figure 3:
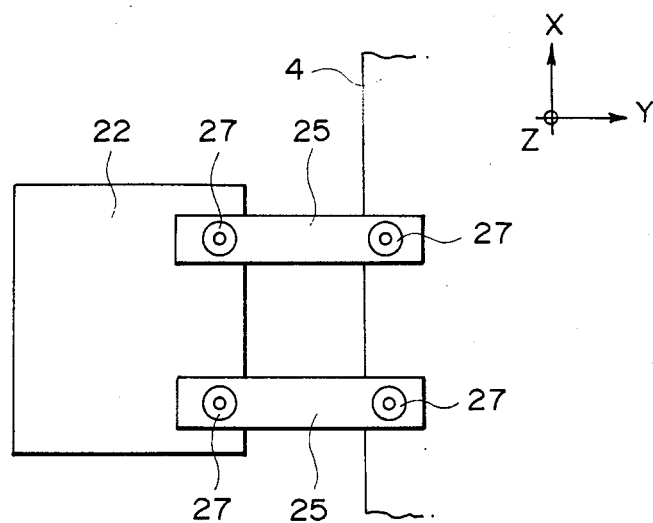
FIG. 3 is a plan view showing a shift-locking device used in the exposure apparatus of the FIG. 2 embodiment.

Referring now to FIG. 2, denoted generally at numerals 22 are shift-locking mechanisms which are provided in accordance with one of the features of the present invention. Of the two shift-locking mechanisms 22, an upper one is arranged to selectively lock the mask stage 2, while a lower one is arranged to selectively lock the base-plate carrying stage 4. Since these two shift-locking mechanisms 22 are of substantially the same structure, description will be made only to the upper shift-locking mechanism 22 for selectively locking the mask stage 2. Description for the lower shift-locking mechanism 22 for selectively locking the stage 4 will be omitted by assigning the same reference numerals to corresponding elements. As shown in FIG. 2, the shift locking mechanism 22 includes a vacuum pad 23 and two leaf springs 25 such as shown in FIG. 3, for coupling the vacuum pad 23 to the mask stage 2. These leaf springs 25 are fixedly secured to the vacuum pad 23 and the mask stage 2 by means of bolts 27. The vacuum pad 23 has a recess 29 formed in its lower surface and a passage 31 formed therewithin so as to supply vacuum or pressurized air to the recess 29. The passage 31 is in fluid-communication with a fluid-supply/evacuation changeover valve 35 such as an electromagnetic valve (solenoid valve) or the like by way of a flexible tube 33. The valve 35 is also in fluid-communication with each of a vacuum source 54 and a pressurized-air source 55 by way of unshown tubes. The pressurized-air source 55 is also in communication with pads of the LAB 8—8 by way of unshown tubes. As for the lower shift-locking mechanism 22 for selectively locking the stage 4, vacuum and pressurized air are supplied to a similar fluid-supply/evacuation changeover valve 35 from the sources 54 and 55, respectively.

Denoted diagrammatically in FIG. 2 by numeral 41 is an alignment detecting system for detecting, by way of the mirror projection optical system 5, the positional relation between the mask 1 and the base plate 3 with the aid of unshown alignment marks. Since the alignment detecting system 41 detects the positional relation by way of or through the mirror projection optical system 5, hereinafter it will be referred to in this Specification as "TTM alignment detecting system" (Through-The-Mirror alignment detecting system). Also denoted diagrammatically by numeral 43 is a mask alignment detecting system for detecting the position of the mask 1 so as to align the mask 1 with respect to a certain reference position. The TTM alignment detecting system 41 is arranged to detect the positional relation between the mask 1 and the base plate 3 at two points on a line extending in the X direction, thereby to detect easily and highly accurately the positional deviation of the mask 1 and the base plate 3 with respect to each of the X, Y and $\theta$ (rotational) directions as well as yawing of the stages 2 and 4. Denoted in this Figure by numeral 45 is a laser interferometer and, by numeral 47 is an L-shaped mirror (square) fixedly mounted on the base-plate carrying stage 4. The laser interferometer 45 and the mirror 47 are co-operative to provide a fine measuring system for measuring or detecting the position of the base-plate carrying stage 4 with respect to the Y direction. While, in FIG. 2, only one measuring system comprising the interferometer 45 and the mirror 47 is illustrated, actually the exposure apparatus is provided with an additional measuring system disposed in the X direction so as to detect the position of the stge 4 with respect to the X direction.

Denoted diagrammatically in FIG. 2 by numeral 49 is a controller comprising a microprocessor, etc. which is provided to control various operations of the exposure apparatus as a whole. For example, the controller 49 controls, in accordance with a predetermined operational sequence, the opening/closing or changeover of the electromagnetic valve 35, the reading of positional information outputted from the detecting systems 41 and 43 and from the laser interferometer 45, and drive of the stage 2 and/or the stage 4 on the basis of the detected positional information. Denoted in FIG. 2 by numerals 51 and 53 are mirrors which are provided, respectively, to deflect the optical paths of the detecting systems 41 and 43.

The operation of each of the shift-locking mechanisms 22 is controlled by controlling the opening/closing or changeover of the corresponding electromagnetic valves 35 by means of the controller 49. Since the shift-locking mechanisms 22 are operated essentially in the same way, only the operation of the upper shift-locking mechanism 22 for selectively locking the mask stage 2 will now be described in detail.

First, in order to allow alignment of the mask 1 with the reference position, the electromagnetic valve 35 is opened so that the tube 33 is communicated with the pressurized-air source 55. By this, the pressurized air from the source 55 is supplied to the recess 29 of the vacuum pad 23 by way of the tube 33 and the passage 31 and, as a result of which, the pressurized air is discharged from the recess 29 onto the lower surface of the pad 23. Thus, an air-bearing is formed relative to a stage sliding surface 6a of the carriage 6, with the result that the vacuum pad 23 becomes movable relative to the carriage 6 and, therefore, it does not interfere with the movement of the mask stage 2 for the position adjustment of the mask 1. In the case of the lower shift-locking mechanism 22 for selectively locking the base-plate carrying stage 4, a similar air-bearing can be formed between the lower surface of the vacuum pad 23 and a stage sliding surface 6b.

On the other hand, upon scanning movement of the carriage 6 for the scanning exposure, the electromagnetic valve 35 is actuated so as to communicate the tube 33 with the vacuum source 54. By this, the recess 29 of the vacuum pad 23 is evacuated by way of the tube 33 and the passage 31 and, as a result of which, the vacuum pad 23 is brought into intimate contact with the stage sliding surface 6a of the carriage 6. Thus, the vacuum pad 23 is fixed to the carriage 6 and, therefore, it effectively prevents undesirable displacement or shift of the mask stage 2 (to which the vacuum pad 23 is connected) relative to the carriage 6 during scanning movement thereof. In the case of lower shift-locking mechanism 22 for the base plate carrying stage 4, similarly, the vacuum when it is supplied to the recess 29 of the vacuum pad 23 brings the pad 23 into intimate contact with the stage sliding surface 6b, thereby to prevent undesirable displacement or shift of the stage 4 relative to the carriage 6 during scanning movement thereof.

In the present embodiment, as has hitherto been described, the vacuum pad 23 and the stage 2 or 4 are connected to each other by use of leaf springs 25 having thickness of an order of, e.g., 0.15 mm. Use of such leaf springs is effective to cancel any difference in height between the vacuum pad 23 and the stage 2 or 4. Also, it allows relative displacement between the vacuum pad 23 and the stage 2 or 4 with respect to the direction of Z axis. Further, in the present embodiment, the leaf springs 25 are disposed so that they extend in the direction of the Y axis which is the scan direction of the carriage 6, such as shown in FIG. 3. A compressive force and a tensile force are applied to the leaf springs 25 in the same direction as the scan direction. Accordingly, the leaf springs 25 are effectively and satisfactorily operable as the fastner means for the vacuum pad 23 and the stage 2 or 4 with respect to the scan direction.

Figure 5:
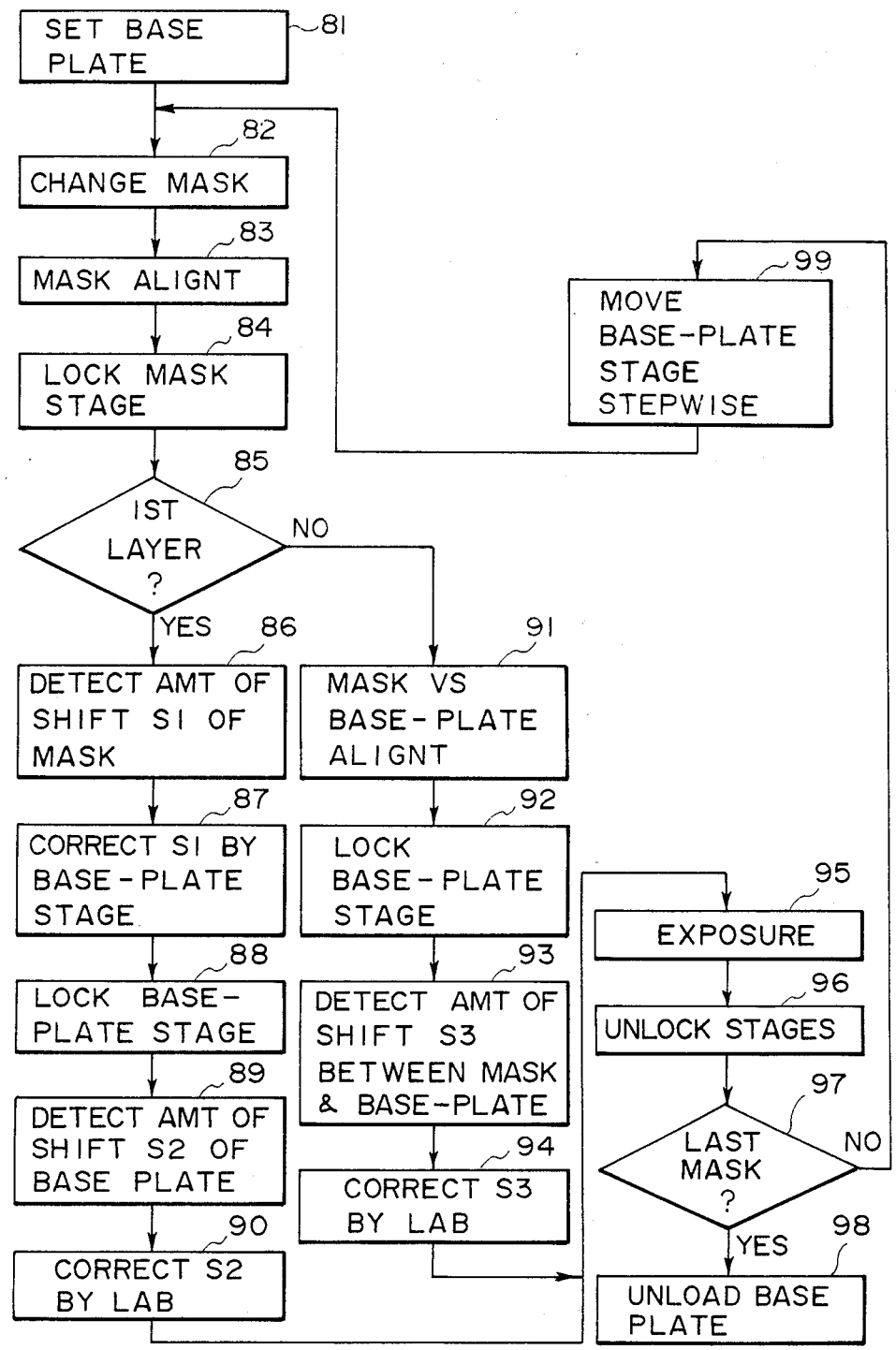
FIG. 5 is a flow chart showing the operation of the exposure apparatus of the FIG. 2 embodiment.

Referring now to a flow chart of FIG. 5, the operation of the exposure apparatus according to the present embodiment and having the structure described in the foregoing will be explained.

First, at Step 81, the controller 49 supplies an instruction signal for driving an unshown base-plate feeding device so as to place a new base plate 3 on the stage 4, and then effects setting (absolute alignment) of the base plate 3 at a predetermined position on the carriage 6. Subsequently, at Step 82, the mask feeder 11 shown in FIG. 1 is actuated so as to place a desired one of the masks 1a–1d on the mask stage 2. That is, for the sake of exposure of a first quarter of the surface of the base plate 3, for example, the mask 1a is placed on the mask stage 2. Where exposure of a second quarter of the base plate 3 is desired, the mask carried by the mask stage 2 is replaced by the mask 1b. Similarly, where exposure of a third or fourth quarter of the base plate 3 is desired, the mask carried on the mask stage 2 is replaced by the mask 1c or 1d. Subsequently, at Step 83, the mask stage 2 is moved on the bases of output signals from the mask alignment detecting system 43, and absolute alignment of the mask carried by the mask stage 2 (i.e. the positioning of the mask with its reference position) is effected. Thereafter, the electromagnetic valve 35 at the mask stage 2 side is switched to its vacuum-supplying position thereby to lock the mask stage 2 (Step 84). Next, at Step 85, discrimination is made as to whether the current exposure (which is going to be effected) is one for the "first layer" of the base plate 3 or not. This discrimination may be made on the basis of data inputted by an operator from an unshown console board. It is a possible alternative that the discrimination is made by detecting any identification mark provided on the mask or by detecting the surface conditions of the base plate.

If the result of discrimination at Step 85 shows that the current exposure is for the first layer, it is discriminated that no alignment mark has been "printed" on the base plate 3 so that relative alignment of the mask 1 and the base plate 3 is not attainable. Therefore, the exposure has to be effected with the mask 1 and the base plate 3 held in their positions assumed at the time of completion of absolute alignment with the respective reference positions. Actually, however, it is possible that the mask stage 2 and thus the mask 1 carried thereon are minutely shifted relative to the carriage 6 at the time at which the mask stage 2 is locked by the shift-locking mechanism 22 at the aforementioned Step 84. If this occurs, the absolute position of the mask 2 is deviated, resulting in unwanted overlapping, separation or offset of the patterns transferred onto the base plate 3 by use of the masks 1a–1d. In consideration thereof, in the present embodiment, the amount S1 of such shift of the mask 1 caused by the locking of the stage 2 is measured or detected on the basis of the output signals from the mask alignment detecting system 43 (Step 86). And, the detected deviation S1 is corrected or compensated for by moving the base-plate carrying stage 4 (Step 87). Subsequently, the solenoid valve 35 at the stage 4 side is switched to its vacuum-supplying position thereby to lock the base-plate carrying stage 4 (Step 88). Similarly, at the time of lock of the stage 4, it is possible that the absolute position of the stage 4 and thus the absolute position of the base plate 3 with respect to the carriage 6 are deviated. In view of this, in the present embodiment, the amount S2 of such shift of the stage 4, as defined by the displacement between the positions of the stage 4 assumed respectively at the times before and after the locking of the stage 4, is measured or detected on the basis of output signals from the laser interferometer 45 (Step 89). The thus detected deviation S2 is corrected or compensated for, at Step 90 by use of the LAB 8—8. More specifically, for this purpose, the discharging air-pressure or the amount of air discharge from each of different portions of the LAB 8—8 is controlled. In other words, the thickness of air pad at each of the different portions of the LAB 8—8 is controlled. By doing so, the position or inclination of the carriage 6 relative to the projection optical system 5 is controlled or changed so as to shift the position of image transfer, on the base plate 3, by an amount cancelling the shift of the image transfer position which otherwise might be caused by the deviation S2. Whereby, the deviation S2 is corrected or compensated for. It will be noted that the correction of the deviation S2 at Step 90 is achieved by actively utilizing a phenomenon of image shift which occurs in an occasion that the positions of the mask 1 and the base plate 3 relative to the projection optical system 5 are deviated or that the carriage 6 is inclined relative to the projection optical system 5. After correction of the deviation S2 at Step 90, the sequence proceeds to Step 95 which will be described later.

If, as compared therewith, the result of discrimination at Step 85 shows that the current exposure is not for the "first layer", the TTM alignment detecting system 41 is operated to detect alignment marks formed on the mask 1 and the base plate 3 to thereby detect the relative position of the mask 1 and the base plate 3. And, on the basis of output signals from the TTM alignment detecting system 41, the base-plate carrying stage 4 is moved so as to effect relative alignment (TTM alignment) of the mask 1 and the base plate 3 (Step 91). Subsequently, the solenoid valve 35 at the stage 4 side is switched to its vacuum supplying position, whereby the base-plate carrying stage 4 is locked (Step 92). Then, by use of the TTM alignment detecting system 41, any relative positional deviation S3 between the mask 1 and the base plate 3, which may be caused by the shift of the stage 4 at the time of lock of the stage 4, is detected (Step 93). Then, air-pad thickness at different portions of the LAB 8—8 is controlled in the similar manner as that made at Step 90, whereby the deviation S3 is corrected (Step 94). Subsequently, the sequence proceeds to Step 95.

At Step 95, the carriage 6 is moved in the Y direction to move the mask 1 and the base plate 3 as a unit relative to the projection system 5 thereby to scanningly expose them to the light from the illumination optical system 7. By this, desired one of the quarters of the base plate 3 is exposed to the pattern of the mask 1 held by the mask stage 2. After completion of exposure, the solenoid valves 35 of the two shift-locking mechanisms 22 are switched to their air-supplying positions to unlock the stages 2 and 4 (Step 96). Then, at Step 97, discrimination is made as to whether the mask used at Step 95 is the last one (such as the fourth mask 1d) or not, i.e. whether the exposures of all the four regions of the base plate 3 have been completed or not. If all the regions have already been exposed, the base-plate carrying stage 4 and the above-described base-plate feeding device are driven so that the base plate 3 carried by the stage 4 is unloaded (Step 98). By this, the exposure operation in connection with that base plate is completed.

If, on the other hand, discrimination at Step 97 shows that the mask used at the last exposure step (Step 95) is not the last one such as the fourth mask 1d, the sequence goes to Step 99 whereat the base-plate carrying stage 4 is moved stepwise so as to place the next quarter region of the base plate 3 at the exposure station. Then, the sequence returns to Step 82, and the operations described with reference to Steps 82–99 are repeated.

Figure 4:
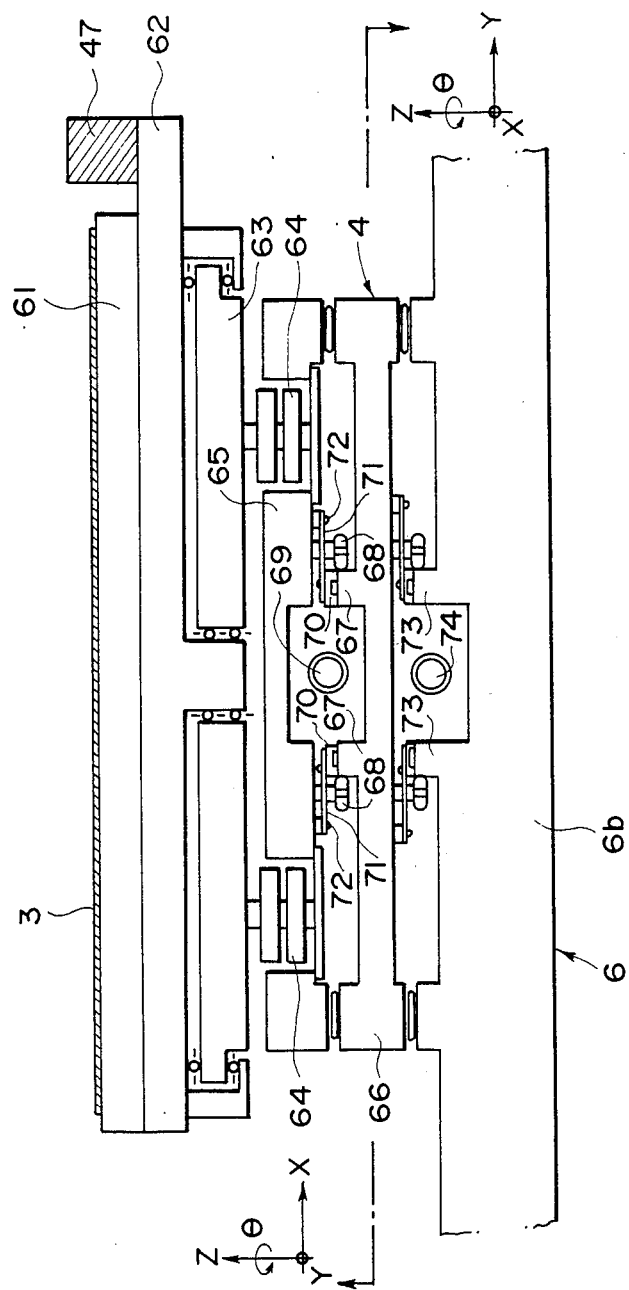
FIG. 4 is a sectional view showing a major portion of an exposure apparatus according to another embodiment of the present invention.

FIG. 4 shows a major portion of an exposure apparatus according to another embodiment of the present invention. More particularly, this Figure is a sectional view showing a base-plate carrying stage 4 into which a shift-locking mechanism according to the present invention is incorporated. Denoted in FIG. 4 by numeral 61 is a chuck for holding a base plate 3; by 62, a θ-table for rotationally moving the base plate 3 together with the chuck 61 in a plane containing the X and Y axes; by 47, an L-shaped mirror (square) to be used with a laser interferometer; by 63, an X-Y table onto which the θ-table 62 is mounted for rotation with the aid of ball bearings; by 64, actuators operative to move the base plate 3 in the Z direction for the sake of focus adjustment or tilt adjustment, the actuators being provided by piezoelectric devices or diaphragms; by 65, a Y-slider; and by 66, an X-slider. The Y-slider 65 is made movable in the Y direction along Y-guides 67 formed on the X-slider 66, in response to rotation of ball-thread assembly 69 driven by an unshown motor. The X-Y table 63 is mounted to the Y-slider 65 by way of the actuators 64. Sliding elements 68 are provided so as to assure movement of the Y-slider 65 following the Y-guides 67. The X-slider 66 is made movable in the X direction along X-guides 73 formed on an upper surface of a base 6b of a carriage 6 and extending in the X direction, in response to rotation of a ball-thread assembly 74 which is driven by an unshown motor. The remaining portion of the structure of the X-slider 66 is substantially the same as the corresponding portion of the Y-slider 65. It is added that an upper half of FIG. 3, including an upper half of the X-slider 66, shows a section of the stage 4 as viewed in the Y direction while a lower half of FIG. 3, including a lower half of the X-slider 66, shows a section of the stage 4 as viewed in the X direction. Denoted in FIG. 4 by numerals 70–72 are components of two shift-locking mechanisms provided in accordance with one of the features of the present invention. Each of the shift-locking mechanisms includes a vacuum pad 70 which is controlled so as to be fixed or movable relative to corresponding one of the Y-guides 67. Leaf springs 71 are provided to connect or couple the vacuum pad 70 and the Y-slider 65 with each other. Also, bolts 72 are provided to fixedly secure the leaf springs 71 to each of the vacuum pad 70 and the Y-slider 65. Upon scanning movement of the carriage 6, the vacuum pads 70 are fixed to the Y-guides 67, whereby unwanted movement of the Y-slider 65 relative to the Y-guides 67 is prohibited as in the embodiment described hereinbefore, and whereby unwanted shift of the X-Y table 63 and, therefore, of the base plate 3 in the Y direction is prevented. In the embodiment of FIG. 4, two additional shift-locking mechanisms are provided between the X-slider 66 and the X-guides 73. This is to prevent unwanted shift of the X-slider 66 in the X direction which may be caused by the acceleration in the X direction due to yawing of the carriage 6 during scanning movement thereof.

While, in the foregoing embodiments, an element having a recess formed in its bottom surface is used as the vacuum pad, such an element having grooves or a number of small holes formed on its bottom surface, or an element having a fluid discharging surface made of a porous material such as a kind of fluid discharging pad is usable as the vacuum pad.

In accordance with the present invention, as has hitherto been described, the stages for the mask and the base plate are locked at the time of scanning exposure. By this, unwanted shift of stages due to the acceleration of the scanning movement can be effectively prevented. Further, any minute shift of the stage which may be caused by the locking of the same is corrected. As a result, the exposure operation can be achieved with the mask and the base plate held in an accurate overlay relation, whereby improvements in the pattern transfer accuracy are attained.

While the invention has been described with reference to the structures disclosed herein, it is not confined to the details set forth and this application is intended to cover such modifications or changes as many come within the purposes of the improvements or the scope of the following claims.

What is claimed is:

1. An apparatus for exposing a plate-like workpiece with patterned radiation, said apparatus comprising:
   a workpiece carrying stage for carrying thereon the workpiece;
   a movable carriage for carrying thereon said workpiece carrying stage for movement relative to said carriage;
   exposing means cooperable with said carriage to scanningly expose the workpiece with patterned radiation by moving said carriage
   means for controlling the movement of said workpiece carrying stage relative to said carriage when the workpiece is not exposed by said exposing means; and
   means for locking said workpiece carrying stage to said carriage during the scanning exposure of the workpiece with said exposing means.

2. An apparatus according to claim 1, wherein said locking means further comprises a vacum means for locking said stage relative to said carriage.

3. An apparatus according to claim 1, wherein said controlling means controls the movement of said workpiece carrying stage so as to allow that different portions of the workpiece are exposed in a predetermined sequence by said exposing means.

4. An apparatus according to claim 1, wherein said exposing means includes an illumination system for illuminating a mask having the pattern and a projection system for projecting an image of at least a portion of the mask onto the workpiece in cooperation with said illumination system.

5. An apparatus according to claim 1, further comprising means for supporting said carriage, means for detecting displacement of said stage relative to said carriage caused by the locking of said stage by said locking means, and means for compensating for the displacement of said stage, as detected by said detecting means, by moving said supporting means.

6. An apparatus according to claim 5, wherein said supporting means further comprises a fluid bearing for supporting said carriage.

7. An apparatus for exposing a plate-like workpiece with patterned radiation, said apparatus comprising:
   a first stage for carrying thereon a mask;
   a second stage for carrying thereon the workpiece;
   a movable carriage for carrying thereon said first and second stages each for movement relative to said carriage;
   exposing means cooperable with said carriage to scanningly expose the workpiece with patterned radiation from the mask by moving the mask on said first stage and the workpiece on said second stage as a unit, by moving said carriage;
   means for controlling the movement of each of said first and second stages when the workpiece is not exposed by said exposing means; and
   means for locking said first and second stages to said carriage during the scanning exposure of the workpiece with said exposing means.

8. An apparatus according to claim 7, further comprising means for detecting displacement of said first stage relative to said carriage caused by the locking of said first stage by said locking means, and means for compensating for the displacement of said first stage as detected by said detecting means, said compensating means compensating the displacement by moving said second stage.

9. An apparatus according to claim 7, wherein said locking means to locks said first stage relative to said carriage and thereafter lock said second stage relative to said carriage.

10. An apparatus according to claim 9, further comprising means for supporting said carriage, means for detecting displacement of said second stage relative to said carriage caused by the locking of said second stage by said locking means, and means for compensating for the displacement of said second stage, as detected by said detecting means, by moving said supporting means.

11. An apparatus according to claim 7, further comprising means for supporting said carriage, means for detecting relative displacement of the mask and the workpiece after the locking of said first and second stages by said locking means, and means for compensating for the relative displacement, as detected by said detecting means, by moving said supporting means.

12. An apparatus for exposing a workpiece with radiation, said apparatus comprising:
   a radiation source;
   a workpiece carrying stage for carrying thereon the workpiece;
   a movable carriage for movably supporting said workpiece carrying stage;
   exposing means for applying radiation from said radiation source to the workpiece carried on said workpiece carrying stage; and
   locking means for locking said workpiece carrying stage to said carriage at least during movement of said carriage, said locking means having an attracting member cooperating with said carriage and a flexible member for coupling said attracting member with said workpiece carrying stage,
   wherein said carriage is moved when the radiation from said radiation source is applied to the workpiece by said exposing means.

13. An apparatus according to claim 12, wherein said attracting member includes a vacuum pad operable by means of a vacuum.

14. An apparatus for exposing a workpiece with radiation, said apparatus comprising:
   a radiation source;
   a workpiece carrying stage for carrying thereon the workpiece;
   a movable carriage for movably supporting said workpiece carrying stage;
   exposing means for applying radiation from said radiation source to the workpiece carried on said workpiece carrying stage;
   locking means for locking said workpiece carrying stage to said carriage at least during the movement of said carriage;
   means for detecting displacement of said workpiece carrying stage relative to said carriage caused by the locking of said workpiece carrying stage to said carriage by said locking means; and
   means for controlling the position of said carriage on the basis of the displacement as detected by said detecting means;
   wherein said carriage is moved when the radiation from said radiation source is applied to the workpiece by said exposing means.

15. An apparatus according to calim 14, further comprising a guide and a fluid bearing member, wherein said carriage is movably supported by said guide and fluid bearing member, and wherein said controlling means is operable to control the position of said carriage by use of said fluid bearing member.

16. An apparatus for exposing a workpiece with patterned radiation, said apparatus comprising:
   a radiation source;
   a mask stage for holding thereon a mask having a pattern;
   a workpiece stage for holding thereon the workpiece;
   a movable carriage for movably supporting said mask stage and said workpiece stage;
   wherein said mask stage has a first suction pad effective to temporarily lock said mask stage to said carriage, and said workpiece stage has a second suction pad effective to temporarily lock said workpiece stage to said carriage;
   exposing means for applying radiation from said radiation source to the mask held on the mask stage and the workpiece held on said workpiece stage; and
   control means effective to initiage the application of the radiation to the workpiece by said exposing means and the movement of said carriage after said mask stage and said workpiece stage are locked to said carriage by said first and second suction pads, respectively,
   wherein said carriage is moved when the radiation is applied to the workpiece by said exposing means.

17. An apparatus according to calim 16, wherein said control means includes a detector for detecting displacement of said mask stage relative to said carriage caused by the locking of said mask stage to said carriage by said first suction pad, and wherein said control means is oeprable to control the relative position of said workpiece stage to said carriage on the basis of the displacement as detected by said detector.

18. An apparatus according to claim 17, wherein said control means includes a detector for detecting displacement of said workpiece stage relative to said carriage caused by the locking of said workpiece stage to said carriage by said second suction pad and wherein said control means is operable to control the relative position of said carriage to said radiation source on the basis of the displacement as detected by said detector.

19. An apparatus according to claim 16, wherein said control means includes a detector for detecting an error between the mask and the workpiece, after said mask stage and said workpiece stage are locked to said carriage by said first and second suction pads and wherein said control means is operable to control the relative position of said carriage to said radiation source on the basis of the error as detected by said detector.

* * * * *

UNITED STATES PATENT AND TRADEMARK OFFICE
CERTIFICATE OF CORRECTION

PATENT NO. : 4,749,867
DATED : June 7, 1988
INVENTOR(S) : KOICHI MATSUSHITA, ET AL.

It is certified that error appears in the above-identified patent and that said Letters Patent is hereby corrected as shown below:

<u>AT [56] IN REFERENCES CITED</u>

U.S. Patent Documents, "Cahzu et al." should read --Cahan et al.--.

<u>COLUMN 1</u>

Line 16, "as and" should read --and as--.

<u>COLUMN 5</u>

Line 4, "stge 4" should read --stage 4--.

<u>COLUMN 6</u>

Line 12, "fastner" should read --fastener--.
    Line 34, "bases" should read --basis--.
    Line 47, "any" should read --an--.

<u>COLUMN 8</u>

Line 42, "73 formed" should read --73, formed--.

<u>COLUMN 9</u>

Line 29, "many" should read --may--.
    Line 42, "carriage" should read --carriage;--.
    Line 51, "vacum" should read --vacuum--.

UNITED STATES PATENT AND TRADEMARK OFFICE
CERTIFICATE OF CORRECTION

PATENT NO. : 4,749,867
DATED : June 7, 1988
INVENTOR(S) : KOICHI MATSUSHITA, ET AL.

It is certified that error appears in the above-identified patent and that said Letters Patent is hereby corrected as shown below:

COLUMN 10

Line 33, "to" (first occurrence) should be deleted.
   Line 34, "lock" should read --locks--.

COLUMN 11

Line 27, "calim 14," should read --claim 14,--.

COLUMN 12

Line 9, "initiage" should read --initiate--.
   Line 17, "calim 16," should read --claim 16,--.

Signed and Sealed this

Eleventh Day of April, 1989

Attest:

DONALD J. QUIGG

Attesting Officer

Commissioner of Patents and Trademarks